United States Patent
Nicolaidis (10) Patent No.: US 7,565,590 B2
(45) Date of Patent: *Jul. 21, 2009

(54) LOGIC CIRCUIT PROTECTED AGAINST TRANSITORY PERTURBATIONS

(75) Inventor: Michael Nicolaidis, Saint Egreve (FR)

(73) Assignee: iROC Technologies, Grenoble (FR)

( * ) Notice: Subject to any disclaimer, the term of this patent is extended or adjusted under 35 U.S.C. 154(b) by 0 days.

This patent is subject to a terminal disclaimer.

(21) Appl. No.: 11/820,714

(22) Filed: Jun. 19, 2007

(65) Prior Publication Data

US 2007/0250748 A1 Oct. 25, 2007

Related U.S. Application Data

(63) Continuation of application No. 09/936,032, filed on Mar. 11, 2002, now Pat. No. 7,380,192.

(30) Foreign Application Priority Data

| Mar. 9, 1999 | (FR) | 99 03027 |
| Mar. 8, 2000 | (FR) | PCT/FR00/00573 |

(51) Int. Cl.
G01R 31/317 (2006.01)
G01R 31/40 (2006.01)

(52) U.S. Cl. .................. 714/724; 714/699

(58) Field of Classification Search .............. None
See application file for complete search history.

(56) References Cited

U.S. PATENT DOCUMENTS

| 3,180,975 | A | * | 4/1965 | Casale, II ............. 377/104 |
| 4,464,754 | A | * | 8/1984 | Stewart et al. ............ 714/805 |
| 4,725,975 | A | * | 2/1988 | Sasaki ............... 703/15 |
| 5,416,362 | A | * | 5/1995 | Byers et al. ............ 327/202 |
| 5,559,461 | A | * | 9/1996 | Yamashina et al. ........ 327/205 |

* cited by examiner

*Primary Examiner*—Cynthia Britt
*Assistant Examiner*—Dipakkumar Gandhi
(74) *Attorney, Agent, or Firm*—Erwin J. Basinski (57) ABSTRACT

The invention concerns a circuit protected against transitory perturbations, comprising a combinatorial logic circuit (10), having at least an output (A); a circuit (20) generating an error control code for said output, and a storage element (24) provided at said output, controlled by the circuit generating a control code to be transparent when the control code is correct, and to maintain its status when the control code is incorrect.

5 Claims, 7 Drawing Sheets

LOGIC CIRCUIT PROTECTED AGAINST TRANSITORY PERTURBATIONS

CROSS-REFERENCE TO RELATED APPLICATIONS

This continuation application claims priority benefit of U.S. application Ser. No. 09/936,032 filed on Mar. 11, 2002, which is now a U.S. Pat. No. 7,380,192, issue date May 27, 2008.

This application is related to the following issued Patents and co-pending U.S. Applications:

U.S. Pat. No. 6,946,985 B2 issued Sep. 20, 2005 titled "Device for Reconfiguring a Faulty Storage Assembly."

U.S. Pat. No. 7,073,102 issued Jul. 4, 2006, titled "Reconfiguration Device for a Faulty Memory."

U.S. Pat. No. 7,093,176 issued Aug. 15, 2006, "Programmable test for memories."

U.S. Pat. No. 7,126,320 issued Oct. 24, 2006, titled "Evaluation of the Characteristics of Electric Pulses."

U.S. patent application Ser. No. 10/492,294 filed Apr. 9, 2004, titled "Circuit Architecture Protected Against Perturbations." Now abandoned.

U.S. Pat. No. 7,124,348 issued Oct. 17, 2006, titled "Data Storage Method with Error Correction."

U.S. patent application Ser. No. 11/904,762 filed Sep. 27, 2007, titled "Circuit Architecture Protected Against Perturbations."—Divisional application of application Ser. No. 10/492,294 now abandoned.

U.S. Pat. No. 7,274,235 titled "Electronic circuitry protected against transient disturbances and method for simulating disturbances" issued Sep. 25, 2007; Ser. No. 11/376,320 Filed: Mar. 16, 2006;

Publication no. 20040219739 titled "Electronic circuit assembly comprising means for decontaminating error-contaminated parts", published Nov. 4, 2004;

Publication no. 20040193967 titled "Electronic circuit assembly comprising at least a storage unit with error correcting means", published Sep. 30, 2004; and Publication no. 20060220716 titled "Electronic circuitry protected against transient disturbances and method for simulating disturbances", published Oct. 5, 2006.

The present invention relates to digital circuits insensitized to external disturbances, especially to localized disturbances coming in particular from heavy ion bombardments.

Such a disturbance is likely to untimely switch the state of a memory point, and specific memory point structures must be adopted to overcome this disadvantage.

With past integrated circuit manufacturing technologies, a memory point was only likely to switch if the disturbance directly affected this memory point. For example, a heavy ion had to reach one of the transistors forming the memory point. Disturbances occurring outside of the memory points, that is, in combinatory logic circuits, had a very low probability of modifying the state of memory points. Indeed, such disturbances would translate as very short pulses, which would be practically filtered out by the high capacitances of the conductors. Even if such a disturbance caused a parasitic pulse reaching the input of a memory cell, this pulse had a low probability of modifying the state of the memory cell.

With recent technologies, the capacitances of conductors become smaller and smaller and the circuits, especially memory cells, react more and more rapidly, so that parasitic pulses caused by disturbances have sufficient durations to modify the memory cell state if they occur in the vicinity of an edge of a clock which clocks the memory cells.

Thus, if it is desired to insensitize a digital circuit of recent technology to localized disturbances, it is not enough to insensitize the memory points, but it must also be avoided for parasitic pulses that could be generated outside of the memory points to reach the memory points.

The generation of a parasitic pulse by a combinatory logic circuit can be considered as a mistake that could be corrected by a conventional solution.

Figure 1:
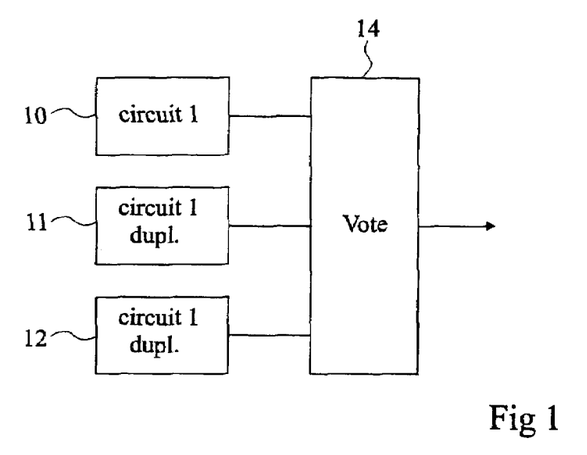
FIG. 1, previously described, illustrates a conventional solution for correcting errors generated by a failing circuit.

FIG. 1 illustrates a conventional solution that could be used to correct errors generated by a combinatory logic circuit. It is a triple-redundancy error-correcting circuit. A same combinatory logic circuit 10 is duplicated twice, respectively at 11 and 12. The outputs of circuits 10 to 12 are provided to a majority vote circuit 14, which outputs the value which is provided by at least two of redundant circuits 10 to 12. The output of majority vote circuit 14 is thus error-free in case of a failure of at most one of redundant circuits 10 to 12, even if this failure is permanent.

Of course, this solution triples the silicon surface area of the integrated circuit.

There are other solutions, which consist of generating error-correcting codes for the outputs of a circuit. When all the outputs of a circuit are desired to be corrected, this solution is equivalent, in terms of surface area, to the triple redundancy of FIG. 1.

An object of the present invention is to provide a solution to remove at the output of a combinatory logic circuit any parasitic pulse caused by a localized disturbance, while occupying a relatively small silicon surface area.

To achieve this object, the present invention provides a circuit protected against transient disturbances, including a combinatory logic circuit having at least one output; a circuit for generating an error control code for said output; and a memory element arranged at said output, controlled by the control code generation circuit to be transparent when the control code is correct, and to keep its state when the control code is incorrect.

According to an embodiment of the present invention, the error control code generation circuit includes a circuit for calculating a parity bit for said output and a circuit for checking the parity of the output and of the parity bit.

According to an embodiment of the present invention, the error control code generation circuit includes a duplicated logic circuit, said memory element being provided to be transparent when the outputs of the logic circuit and of the duplicated circuit are identical, and to keep its state when said outputs are different.

According to an embodiment of the present invention, the error control code generation circuit includes an element for delaying said output by a predetermined duration greater than the maximum duration of transient errors, said memory element being provided to be transparent when the outputs of the logic circuit and of the delay element are identical, and to keep its state when said outputs are different.

According to an embodiment of the present invention, said memory element is formed from a logic gate providing said output of the logic circuit, this logic gate including at least two first transistors controlled by a signal of the logic circuit and at least two second transistors controlled by the corresponding signal of the duplicated circuit, each of the second transistors being connected in series with a respective one of the first transistors.

The present invention also provides a circuit protected against transient disturbances, including a combinatory logic circuit having at least one output connected to a first synchronization flip-flop rated by a clock, a second flip-flop connected to said output and rated by the clock delayed by a predetermined duration, and a circuit for analyzing the outputs of the flip-flops.

According to an embodiment of the present invention, the analysis circuit indicates an error if the flip-flop outputs are different.

According to an embodiment of the present invention, the circuit includes a third flip-flop connected to said output and rated by the clock delayed by twice the predetermined duration, the analysis circuit being a majority vote circuit.

The present invention further provides a circuit protected against transient disturbances, including a combinatory logic circuit having at least one output connected to a first synchronization flip-flop rated by a clock, a second flip-flop rated by the clock and receiving said output delayed by a predetermined duration, and a circuit for analyzing the flip-flop outputs.

According to an embodiment of the present invention, the analysis circuit indicates an error if the flip-flop outputs are different.

According to an embodiment of the present invention, the circuit includes a third flip-flop rated by the clock and receiving said output delayed by twice the predetermined duration, the analysis circuit being a majority vote circuit.

The present invention further provides a circuit protected against transient disturbances, including three identical logic circuits. Each of the logic circuits is preceded by a two-input memory element respectively receiving the outputs of the two other logic circuits, each memory element being provided to be transparent when its two inputs are identical, and to keep its state when the two inputs are different.

According to an embodiment of the present invention, the logic circuits are inverters and the memory elements include, in series, two P-channel MOS transistors and two N-channel MOS transistors, a first one of the inputs of the memory element being connected to the gates of a first one of the P-channel MOS transistors and of a first one of the N-channel MOS transistors, and the second input of the memory element being connected to the gates of the two other transistors.

The foregoing and other objects, features and advantages of the present invention, will be discussed in detail in the following non-limiting description of specific embodiments in connection with the accompanying drawings, wherein:

Several solutions are provided according to the present invention to suppress parasitic pulses generated by a combinatory logic circuit after a localized disturbance, for example due to a heavy ion bombardment. All these solutions, to reach particularly simple structures, exploit the fact that the parasitic pulses form transient, and not permanent, errors. The embodiments of the present invention thus avoid use of conventional solutions, with a triple redundancy or multiple error correction codes, intended to correct a permanent failure of a circuit.

Figure 2A:
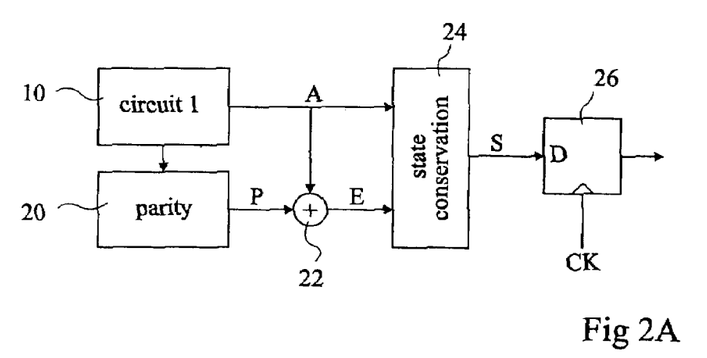
FIG. 2A schematically shows a first embodiment of a circuit according to the present invention enabling suppression of parasitic pulses generated by localized disturbances in a combinatory logic circuit.

FIG. 2A schematically shows a first embodiment of the present invention exploiting this feature. A combinatory logic circuit 10 is associated with a checking circuit 20 which provides an error control code P for the output A of logic circuit 10. Circuit 20 is for example a circuit which conventionally calculates a parity bit P for output A of logic circuit 10, with, of course, the possibility for output A to be multiple. At 22, parity bit P is combined by X-OR with output A of logic circuit 10, which provides an error signal E which is active when the parity is bad, that is, when output A or parity bit P includes an error.

Error signal E and output A are provided to what will be called a "state-keeping" element 24. This actually is a memory element similar to a controlled transparency flip-flop, that is, having a first mode, selected when error signal E is inactive, where output A is transmitted as such to output S of element 24. In a second mode, selected when error signal E is active, element 24 keeps the state of output A such as it was before activation of error signal E.

A flip-flop 26, conventionally provided to lock the output of logic circuit 10, receives output S of state-keeping element 24 instead of directly receiving output A of circuit 10. Flip-flop 26 is rated by a clock CK intended to make the output of circuit 10 synchronous with the outputs of other circuit. Flip-flop 26 is a register in the case where output A is multiple. This flip-flop or this register have, preferably, a structure insensitive to localized disturbances.

Figure 2B:
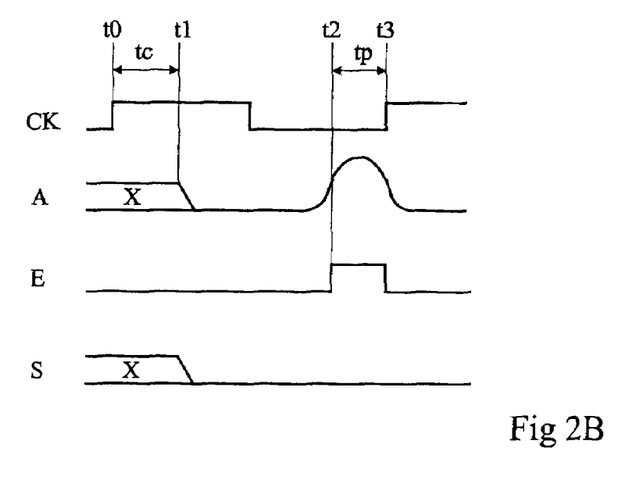
FIG. 2B shows a timing diagram illustrating the operation of the circuit of FIG. 2A.

FIG. 2B shows a timing diagram illustrating the operation of the circuit of FIG. 2A. At a time $t_0$, when a first active edge of clock CK appears, output A of logic circuit 10 is at any state X. Error signal E being inactive, element 24 is in "transparent" mode and transmits state X on its output S. State X is locked in flip-flop 26. The output of flip-flop 26 being possibly fed back into logic circuit 10, this logic circuit generates a new output A after a delay $t_c$ corresponding to the propagation time in the "critical path" of circuit 10.

At a time $t_1$, output A of circuit 10 switches states, for example, switches to 0. The same occurs for output S of element 24, which is again set to the "transparent" mode by signal E.

At a time $t_2$ starts a parasitic pulse on output A, which ends at a time $t_3$. FIG. 2B illustrates an unfavorable case where the parasitic pulse on signal A risks causing an untimely modification of the state of flip-flop 26. In this example, the end of the parasitic pulse coincides with the next active edge of clock CK, which edge causes the memorization in flip-flop 26 of the state of output S immediately preceding time $t_3$. Now, error signal E becomes active for the duration $t_p$ of the parasitic pulse, making element 24 "opaque" to the variation of signal A between times $t_2$ and $t_3$. Accordingly, signal S does not switch states during the parasitic pulse and the flip-flop 26 memorizes a correct value.

A flip-flop only switches states if the new state has been presented long enough thereto before the corresponding active clock cycle, for a so-called initialization duration. In fact, a risk of memorizing an erroneous value by flip-flop 26 appears in a variation range of the position of the parasitic pulse, from a position where the end of the pulse precedes the active edge of clock CK by the initialization duration, to a position where the beginning of the pulse occurs at the time of the active edge of clock CK.

Further, given that state-keeping element 24 also is a memorization cell, the state that it must memorize must have been presented at least for one initialization time before the memorization order (activation of signal E). Thus, it is necessary for the duration separating times $t_1$ and $t_2$ to be longer that this initialization time. Further, it must also be guaranteed that an entire initialization time of element 24 has elapsed before or after the parasitic pulse between times $t_1$ and $t_3$, this to be sure that element 24 takes account of the level outside of the pulse.

These constraints impose the choice of a minimum duration of the period of clock CK, equal to $t_c+2t_{h24}+t_p+t_{h26}$, where $t_c$ is the propagation time in the critical path of logic circuit 10, $t_{h24}$ is the initialization time of element 24, $t_p$ is the maximum duration of a parasitic pulse, and $t_{h26}$ is the initialization time of flip-flop 26. In some cases, especially if element 24 has a capacitive memorization effect, this period can be reduced by $t_{h24}$.

This solution thus requires, with respect to a normal logic circuit, increasing the clock period. Indeed, in a normal circuit, the clock period must only be greater than $t_c+t_{h26}$. However, due to this time redundancy, the circuit provides the same security level as a conventional triple-redundancy circuit (FIG. 1) with a substantially lower hardware cost.

A state-keeping element 24 will generally be formed from logic gates providing the outputs of combinatory logic circuit 10 to flip-flops 26.

Figure 3A:
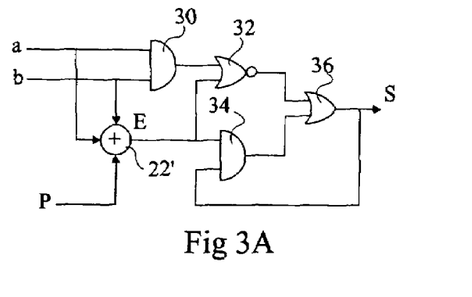
FIGS. 3A and 3B show two examples of state-keeping elements used in the circuit of FIG. 2A.
Figure 3B:
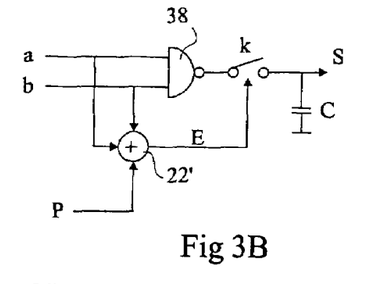

FIGS. 3A and 3B show two examples of state-keeping elements performing a two-input NAND function. Both inputs a and b will be provided to an AND gate 30 having its output connected to a first input of a NOR gate 32. An XOR gate 22', equivalent to XOR gate 22 of FIG. 2A, receives inputs a and b, as well as parity bit P. Output E of gate 22' is provided to a second input of NOR gate 32 and to a first input of an AND gate 34. The outputs of gates 32 and 34 are provided to an OR gate 36, which provides output S of the state-keeping element, which output is looped back on a second input of AND gate 34.

When there is no parity error, signal E is at zero. Then, the output of AND gate 30 is inverted by NOR gate 32 and transmitted to output S by OR gate 36.

In case of a parity error, signal E is at 1, causing a memorization of the state of output S in a memory point formed by gates 34 and 36.

The circuit of FIG. 3A requires four gates to perform the function of a single gate.

FIG. 3B shows a solution requiring less hardware to form a state-keeping element performing a NAND function. Input signals a and b are provided to the two inputs of a NAND gate 38 having its output connected to a capacitor C via a switch K. Switch K is controlled by error signal E provided by XOR gate 22'.

When error signal E is inactive, switch K is closed and capacitor C charges to the level provided by gate 38. When error signal E is activated, switch K is open, but the state of output S of the element is kept by capacitor C for the duration of the parasitic pulse. It should be noted that capacitor C can be formed by the mere capacitance of output line S.

State-keeping elements performing other logic functions may be formed by those skilled in the art. For example, to perform the identity function while using the solution of FIG. 3B, the single input signal is directly provided to switch K.

The embodiment of FIG. 2A has the disadvantage, especially if the number of outputs A of logic circuit 10 is large, that XOR gate 22, with several inputs, reacts with a significant delay to activate error signal E. This results in that a portion of the beginning of the parasitic pulse is transmitted to output S. However, in most cases, the duration of this pulse portion will be smaller than the initialization time of flip-flop 26 and accordingly does not affect its state.

Figure 4:
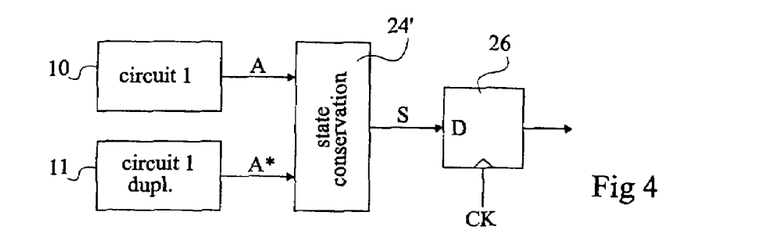
FIG. 4 schematically shows a second embodiment of the circuits according to the present invention enabling suppression of parasitic pulses.

FIG. 4 shows an embodiment avoiding this disadvantage.

Combinatory logic circuit 10 is duplicated once at 11. Output A of circuit 10 and duplicated output A* of circuit 11 are provided to a state-keeping element 24' which transmits on its output S the state of its input A or A* when inputs A and A* are identical and which keeps its state when inputs A and A* become different.

The operation of this circuit is similar to that of FIG. 2A, considering that a condition where inputs A and A* are different corresponds to the activation of error signal E in FIG. 2B.

Figure 5:
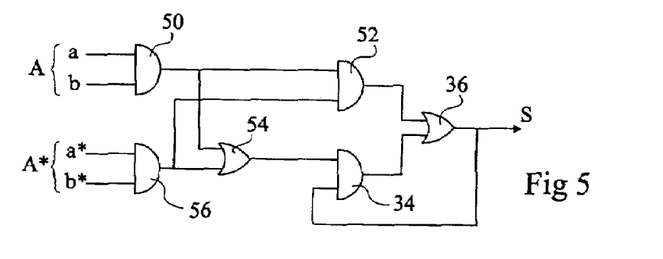
FIG. 5 shows an example of a state-keeping element used in the circuit of FIG. 4.

FIG. 5 shows a state-keeping element 24' of the circuit of FIG. 4 implementing a two-input AND function. Inputs a and b are provided to an AND gate 50 having its output provided to a first input of an AND gate 52 and to a first input of an OR gate 54. Duplicated inputs a* and b* are provided to an AND gate 56 having its output connected to the second input of gate 52 and to the second input of gate 54. The outputs of gates 52 and 54 are respectively connected to gates 36 and 34 similar to gates 36 and 34 of FIG. 3A.

It should be noted that gates 34, 36, 52, and 54 form a state-keeping element having the logic "identity" function. To create any logic function, it is enough to connect two gates, each conventionally implementing this function, to gates 52 and 54.

According to another embodiment, the state-keeping elements are formed based on the internal structure of conventional logic gates. For this purpose, two series-connected transistors are provided for each transistor normally required in the conventional gate. The two transistors are controlled to be turned off at the same time, so that, if one of them turns on due to a disturbance, the second, remaining off, prevents any untimely current flow. Such a configuration is particularly well adapted to a structure of the type of that in FIG. 4, including two redundant logic circuits. Indeed, the two transistors of the series association are then respectively controlled by a signal and by its duplicated signal.

Figure 6A:
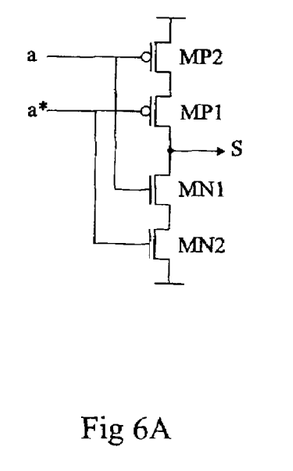
FIGS. 6A, 6B, and 6C show other examples of state-keeping elements of the type used in the circuit of FIG. 4.

FIG. 6A shows a state-keeping element according to this principle having an inverter function. Output S of the circuit is connected to a high voltage via two P-channel MOS transistors in series, MP1 and MP2. Output S is also connected to a low voltage by two N-channel MOS transistors in series MN1 and MN2. A first one of the two P-channel MOS transistors and a first one of the two N-channel MOS transistors are controlled by a normal signal a while the remaining transistors are controlled by the duplicated signal a*.

If signals a and a* are equal, which corresponds to a normal operation, the two MP transistors or the two MN transistors are on and force output S to the corresponding voltage to perform the inverter function.

If signals a and a* are different, at least one of transistors MP and at least one of transistors MN is off, whereby output S is floating and keeps its preceding level by capacitive effect.

Figure 6B:
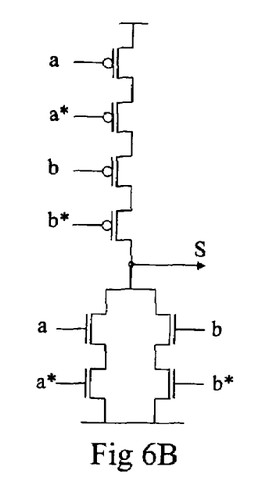

FIG. 6B shows a state-keeping element performing a NOR function. Its output S is connected to a high voltage via four P-channel MOS transistors in series, respectively controlled by the normal input signals a and b and their duplicated signals a* and b*. Output S is also connected to a low voltage via two series associations of N-channel MOS transistors, one of them including two transistors respectively controlled by signals a and a*, the other including two transistors respectively controlled by signals b and b*.

Figure 6C:
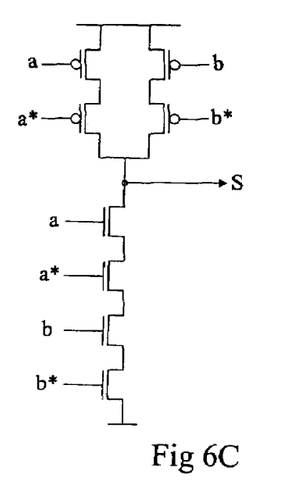

FIG. 6C shows a state-keeping element performing a function. Output S is connected to the low voltage via four N-channel MOS transistors in series respectively controlled by signals a and b and their duplicated signals a* and b*. Output S is also connected to the high voltage via two series associations of P-channel MOS transistors, the first one including two transistors respectively controlled by signals a and a*, and the second one including two transistors respectively controlled by signals b and b*.

The elements of FIGS. 6B and 6C operate according to the principle described in relation with FIG. 6A. More generally, this principle of arranging duplicated transistors in series applies to any logic gate.

The circuit of FIG. 6A can be used as a dynamic memory cell insensitive to disturbances. For this purpose, the cell state is stored redundantly on both inputs a and a* by capacitive effect. If one of the inputs is disturbed, output S keeps its preceding state by capacitive effect, until the cell refreshment restoring the correct state of the disturbed input. This principle also applies to any state-keeping element (FIGS. 3A, 3B, 5, 6B, 6C). For this purpose, it is enough to use a storage element (capacitor, static memory) on the inputs of the state-keeping element, and to lock the values provided by output A of circuit 10 and by the output of the error-checking circuit (20, 11).

Other state-keeping elements may also be used, such as a specific storage element described in "Upset Hardened Memory Design for Submicron CMOS Technology", 33$^{rd}$ International Nuclear and Space Radiation Effects Conference, July 1996, Indian Wells, Calif., by T. Calin, M. Nicolaidis, R. Velazco.

Figure 7A:
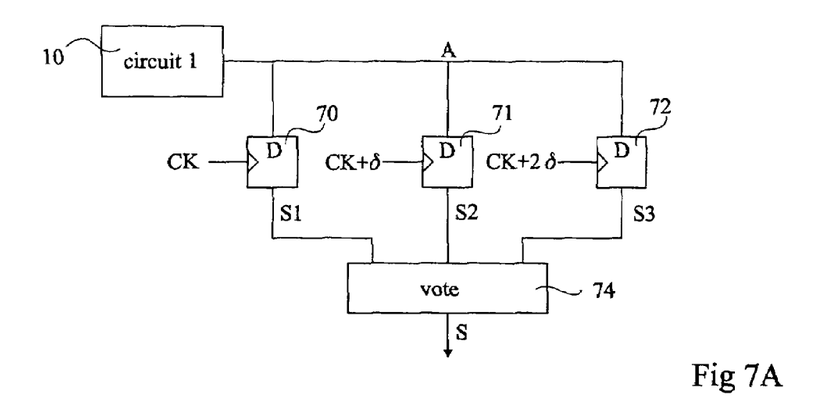
FIG. 7A schematically shows a third embodiment of a circuit according to the present invention enabling suppression of parasitic pulses.

FIG. 7A shows a third embodiment of a combinatory circuit according to the present invention, insensitive to localized disturbances. It includes a single logic combinatory circuit 10. The suppressing of parasitic pulses is exclusively obtained by means of a time redundancy, conversely to the preceding embodiment combining the time and hardware redundancy. Output A of circuit 10 is provided to three flip-flops 70, 71, and 72 respectively rated by clock CK, by clock CK delayed by a duration δ, and by clock CK delayed by a duration 2δ. Outputs S1, S2, and S3 of these flip-flops are provided to a majority vote circuit 74 which provides corrected output S.

Figure 7B:
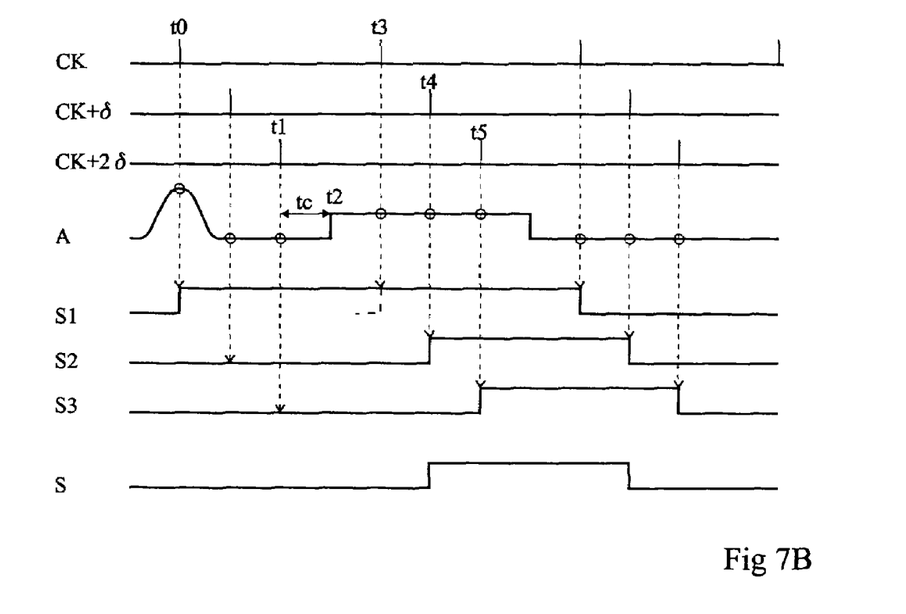
FIG. 7B shows a timing diagram illustrating the operation of the circuit of FIG. 7A.

FIG. 7B shows a timing diagram illustrating the operation of the circuit of FIG. 7A. This timing diagram show, in the form of vertical bars, the active edges of clock signals CK, CK+δ, and CK+2δ. It is assumed that signal A exhibits a parasitic pulse overlapping the first edge of clock CK, occurring at a time $t_0$. Flip-flop 70, activated at time $t_0$, erroneously stores the state of the parasitic pulse.

At a time $t_2$, signal A switches normally to 1. This transition occurs one time interval $t_c$ after a time $t_1$ of occurrence of the last edge of clock CK+2δ. Time $t_c$ is the propagation time through vote circuit 74 and logic circuit 10.

At times $t_3$, $t_4$, and $t_5$, state 1 of signal A is sampled by the next respective edges of clocks CK, CK+δ and CK+2δ. Signal S1 remains at 1 while signals S2 and S3 switch to 1, respectively at times $t_3$, $t_4$ and $t_5$.

One time interval $t_c$ after time $t_5$, signal A switches to 0. As a result, at the next edges of clocks CK, CK+δ and CK+2δ, signals S1, S2, and S3 successively switch to 0.

Output S of vote circuit 74 is at 1 when at least two of signals S1, S2, and S3 are at 1. This case occurs from time $t_4$, while signal S2 is at 1.

It should be noted that the circuit of FIG. 7A does not switch to 1 at time $t_0$ when the parasitic pulse occurs, but correctly switches to 1 at time $t_4$ as a response to a normal switching to 1 of signal A.

For this embodiment to operate properly, the parasitic pulse must be sampled by a single one of clocks CK, CK+δ, and CK+2δ. The maximum duration $t_p$ of the parasitic pulses may for this purpose reach value δ-$t_h$, where $t_h$ is the initialization time of flip-flops 70 to 72. Thus, it is chosen to have δ=$t_p$+$t_h$. Further, the clock period must be chosen to be at least equal to $t_c$+2δ+$t_h$, which time corresponds to the maximum propagation time from the inputs of circuit 10 to output S.

Figure 8A:
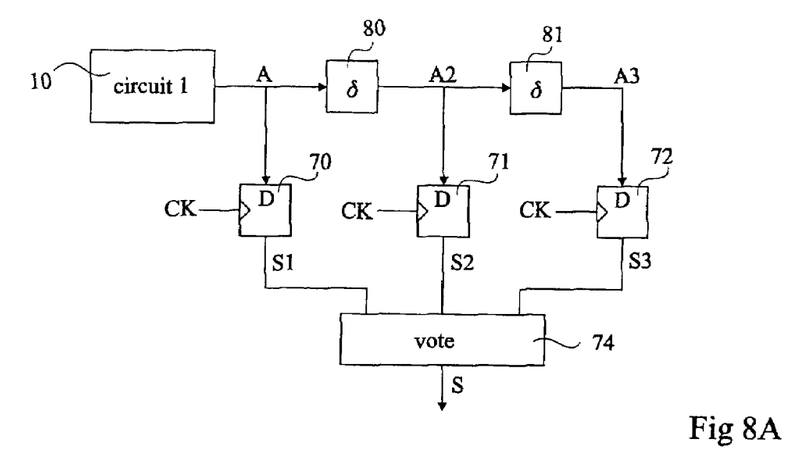
FIG. 8A shows an alternative to the embodiment of FIG. 7A.

FIG. 8A shows an alternative to the embodiment of FIG. 7A. In this drawing, same elements as in FIG. 7A are designated with same references. Instead of rating flip-flops 70 to 72 with clocks delayed with respect to one another, these flip-flops are rated by the same clock CK. However, signal A is provided to two delay lines in cascade 80 and 81, each introducing a delay δ. Signal A is directly provided to flip-flop 70, output A2 of delay line 80 is provided to flip-flop 71, and output A3 of delay line 81 is provided to flip-flop 72.

Figure 8B:
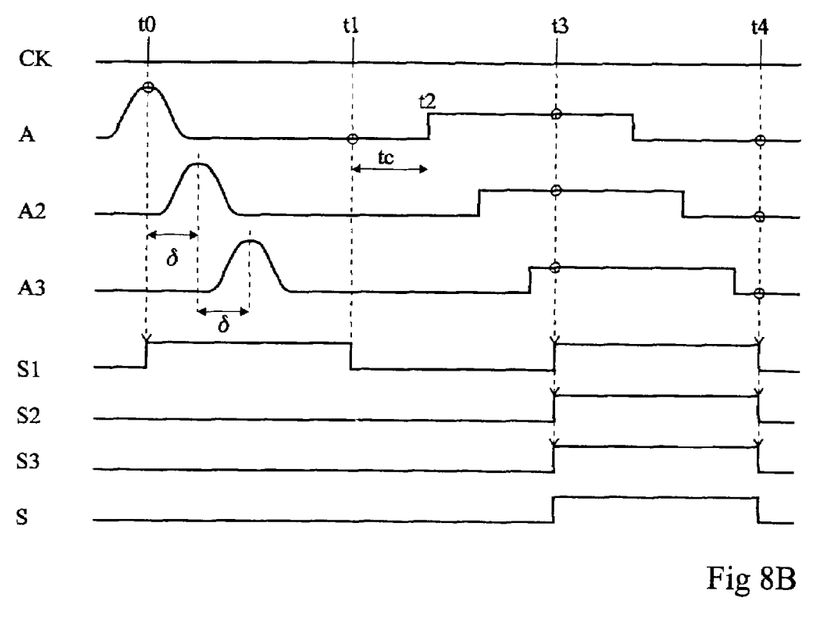
FIG. 8B shows a timing diagram illustrating the operation of the circuit of FIG. 8A.

FIG. 8B shows a timing diagram illustrating the operation of the circuit of FIG. 8A. At a time $t_0$ occurs the first edge of clock CK. It is assumed that signal A exhibits a parasitic pulse overlapping this edge. As a result, signal S1 switches to one at this time $t_0$. Signals A2 and A3 exhibit the same parasitic pulse, but shifted respectively by δ and 2δ with respect to time $t_0$.

Delay δ is chosen to be greater than duration $t_p$+$t_h$, where $t_p$ is the maximum duration of a parasitic pulse and $t_h$ is the initialization time of flip-flops 70 to 72. It is thus ensured, in the example of FIG. 8B, that the parasitic pulse of signal A2 is not sampled at time $t_0$. As a result, the value of signal S2, and a fortiori of signal S3, remains correct (here, equal to 0).

At time $t_1$ occurs the next edge of clock CK. Signals A to A3 are sampled while they are at 0. As a result, signal S1 switches to 0 and signals S2 and S3 remain at 0.

At a time $t_2$, between time $t_1$ and the next edge of clock CK occurring at a time $t_3$, signal A switches normally to 1 during a clock period. The duration separating times $t_1$ and $t_2$ corresponds to propagation time $t_c$ in the critical path of circuit 10 and in vote circuit 74. In the example shown, delay $t_c$ is such that the corresponding rising edge of signals A2 and A3 occurs still before time $t_3$.

Thus, at time $t_3$, signals A, A2, and A3 are sampled while they are at 1. Signals S1, S2, and S3 switch to 1. Signals S1, S2, and S3 remain at 1 until the next edge of the clock signal occurring at a time $t_4$. At this time $t_4$, signals A, A2, and A3 are switched to 0. As a result, signals S1, S2, and S3 switch to 0.

Signal S has a correct shape in remaining at 0 between times $t_0$ and $t_1$, and in switching to 1 between times $t_3$ and $t_4$, while signals S1, S2, and S3 are all three at 1.

The correct operation illustrated in FIG. 8B is obtained provided that the minimum value of the clock period is equal to $t_c+2\delta+t_h$.

Figure 9A:
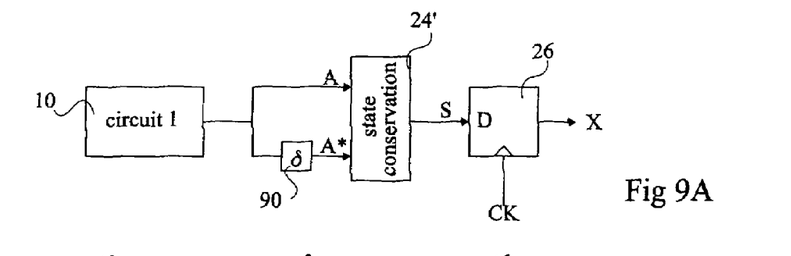
FIG. 9A shows a fourth embodiment of a circuit according to the present invention enabling suppression of parasitic pulses.

FIG. 9A schematically shows a fourth embodiment of a circuit according to the present invention enabling suppressing parasitic pulses. A state-keeping element 24' of the type of that in FIG. 4, provided to operate with duplicated signals, is here used. This element receives output A of logic circuit 10 and this same output is delayed by a delay line 90 introducing a delay $\delta$. The signal provided by delay line 90 forms duplicated signal A*. Output S of element 24' is provided to a flip-flop 26.

Figure 9B:
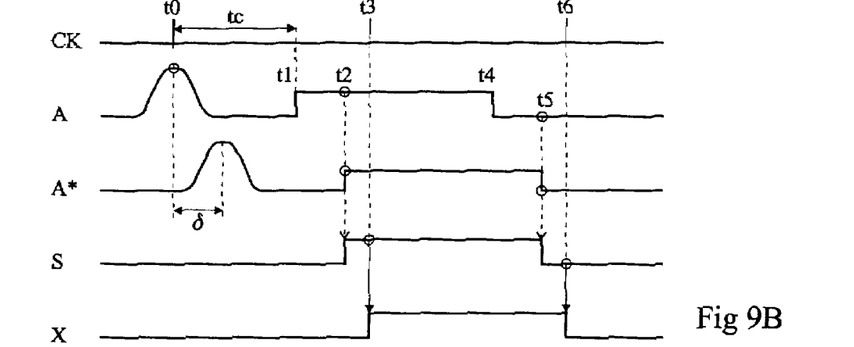
FIG. 9B shows a timing diagram illustrating the operation of the circuit of FIG. 9A.

FIG. 9B shows a timing diagram illustrating the operation of the circuit of FIG. 9A. As in the preceding examples, signal A exhibits a parasitic pulse overlapping a first edge of clock CK occurring at a time $t_0$.

At a time $t_1$, before the next rising edge of clock CK occurring at a time $t_3$, signal A switches to 1. Times $t_0$ and $t_1$ are distant by propagation time $t_c$ in the critical path of circuit 10.

At a time $t_2$, also occurring before time $t_3$, delayed signal A* switches to 1.

Signals A and A* remain at 1 for one clock period and switch to 0 at respective times $t_4$ and $t_5$ before the next clock edge occurring at time $t_6$.

Signal S provided by state-keeping circuit 24' only switches state at the time when signals A and A* become equal. This only occurs at time $t_2$ when signal A* switches to 1 while signal A already is at 1, and at time $t_5$ when signal A* switches to 0 while signal A already is at 0 (the propagation time of element 24' is here neglected for clarity reasons).

Thus, signal S is at 1 between times $t_2$ and $t_5$. This state 1 is sampled by flip-flop 26 at time $t_3$, and corresponds to the state to be effectively sampled in signal A.

The operation of this circuit is correct if the clock period is at least equal to $t_c+\delta+2t_{24'}+t_p+t_h$, where $t_{24'}$ is the propagation time in element 24' and $t_h$ is the initialization time of flip-flop 26. Value $\delta$ must be chosen to be greater than $t_p-t_{24'}$.

Figure 10A:
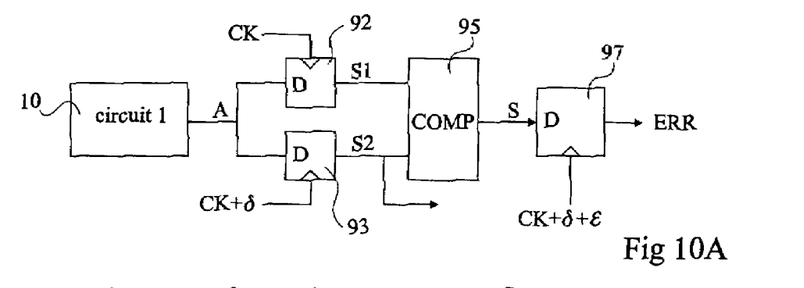
FIG. 10A schematically shows a fifth embodiment of a circuit according to the present invention enabling suppression of parasitic pulses.

FIG. 10A schematically shows a fifth embodiment of the circuit according to the present invention, enabling simple detection of an error due to a parasitic pulse. Output A of logic circuit 10 is provided to two flip-flops 92 and 93, one being rated by clock CK and the other one by the clock delayed by a duration $\delta$. As an alternative, flip-flop 92 can be controlled by an edge or level of a first type (rising or falling—high or low) of a clock CK, while flip-flop 93 is controlled by an edge or level of the opposite type of the same clock (falling or rising edge—low or high). Outputs S1 and S2 of these flip-flops are provided to a comparator 95, the output of which is provided to a flip-flop 97. Flip-flop 97 is rated by a clock CK+$\delta$+$\epsilon$, slightly delayed with respect to signal CK+$\delta$. Flip-flop 93 is here used to synchronize signal A and its output S2 may be looped back onto the inputs of logic circuit 10.

Figure 10B:
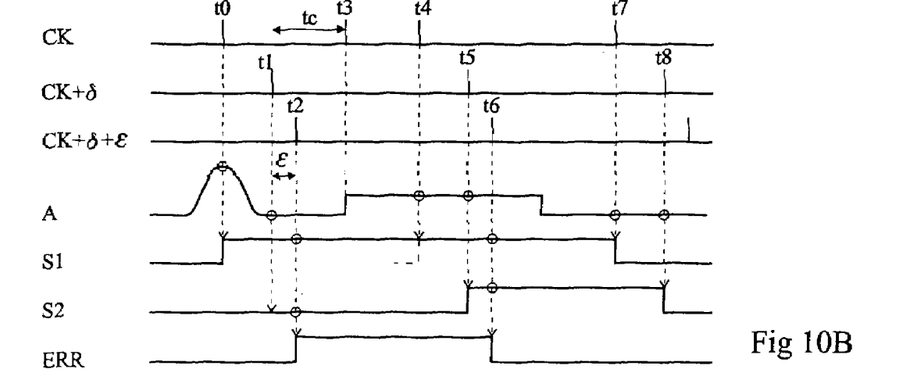
FIG. 10B shows a timing diagram illustrating the operation of the circuit of FIG. 10A.

FIG. 10B shows a timing diagram illustrating the operation of the circuit of FIG. 10A. As in the preceding example, a parasitic pulse occurs in signal A overlapping an edge of signal CK occurring at a time $t_0$. As a result, signal S1 switches to 1. However, flip-flop 93 does not sample signal A yet and its output S2 remains unchanged (at 0). Comparator 95 does not indicate an inequality of signals S1 and S2 yet, and signal ERR indicates no error by a state 0.

At a time $t_1$ occurs the next edge of clock CK+$\delta$, after the parasitic pulse in signal A. Signal S2 remains unchanged.

At a time $t_2$, one duration $\epsilon$ after the first edge of signal CK+$\delta$, occurs the next edge of clock CK+$\delta$+$\epsilon$, which edge causes the sampling of the comparator output by flip-flop 97. Signals S1 and S2 being different, error signal ERR is activated.

At a time $t_3$, one interval $t_c$ after time $t_1$, signal A normally switches to 1. This state 1 is sampled by clock CK at a time $t_4$. Signal S1 remains at 1.

At a time $t_5$ occurs the next edge of clock CK+$\delta$, which samples signal A while said signal still is at 1. Signal S2 switches to 1. Signal A will switch to 0 after propagation interval $t_c$.

At a time $t_6$ occurs the next edge of clock CK+$\delta$+$\epsilon$, which samples the output of comparator 95. Signals S1 and S2 being at the same state, error signal ERR is deactivated.

At a time $t_7$ occurs the next edge of clock CK, which samples signal A while said signal is at 0. Signal S1 switches to 0.

At a time $t_8$ occurs the next edge of clock CK+$\delta$, which samples signal A while said signal is at 0. As a result, signal S2 switches to 0.

The clock period must be chosen to be at least equal to $t_c+t_h+\delta$, duration $\delta$ being at least equal to duration $t_p+t_h$.

According to an alternative, not shown, of the circuit of FIG. 10A, output S1 is exploited. Then, it must be ascertained that a transition of output S1 is not propagated towards output A before the next edge of clock CK+$\delta$. In other words, propagation time $t_c$ must be longer than $\delta$. In this case, the clock period will be equal to $t_c+t_h$, that is, equal to the clock period of the conventional circuit with no protection against transient errors.

The error signal provided by the circuit of FIG. 10A may be exploited in various ways to correct the detected error. This error signal may for example trigger an operation resumption, for example, the repeating of a last "instruction" executed by the system.

It may also be used to correct a synchronization error due to the use of too fast a clock. In case of an error, a resumption is triggered and the clock frequency is reduced during the resumption. This is particularly advantageous in the case of the alternative exploiting output S1, in which the circuit operates at the speed of the conventional circuit.

According to another alternative, not shown, of the circuit of FIG. 10A, flip-flops 92 and 93 are rated by the same clock CK and one of them receives signal A delayed by duration $\delta$.

Many digital circuit form asynchronous loops, that is, their outputs are directly looped back onto their inputs, without passing through a synchronization flip-flop. Static memory cells are an example of this. Such circuits are likely to memorize a state and are thus sensitive to disturbances risking to switch this state.

Figure 11:
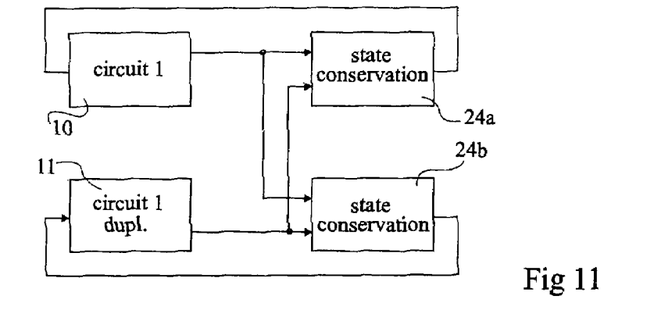
FIG. 11 shows an application of the embodiment of FIG. 4 to an asynchronous loop.

FIG. 11 shows an arrangement according to the present invention to protect such a circuit, using the duplication s principle of FIG. 4. The output of a logic circuit 10 and the output of a duplicated logic circuit 11 are respectively connected to the two inputs of a first state-keeping element 24a and of a second state-keeping element 24b, both of the type of that in FIG. 4. The output of element 24a is looped back on circuit 10, while the output of element 24b is looped back on circuit 11. It is necessary to use two state-keeping elements, since if a single one was used, with its output looped back on both circuits 10 and 11, a disturbance in the element would be transmitted to the two duplicated circuits, causing the same error in both circuits. This error condition would not be corrected.

The structure of FIG. 11 is however sensitive to a disturbance occurring on the output of one of the state-keeping elements. If the propagation time in the involved circuit 10 or 11 is shorter than the duration of the disturbance, the delayed disturbance arrives onto the input of the state-keeping element before the disturbance has disappeared on its output. As a result, the element tends to keep the erroneous state affected by the disturbance.

Figure 12:
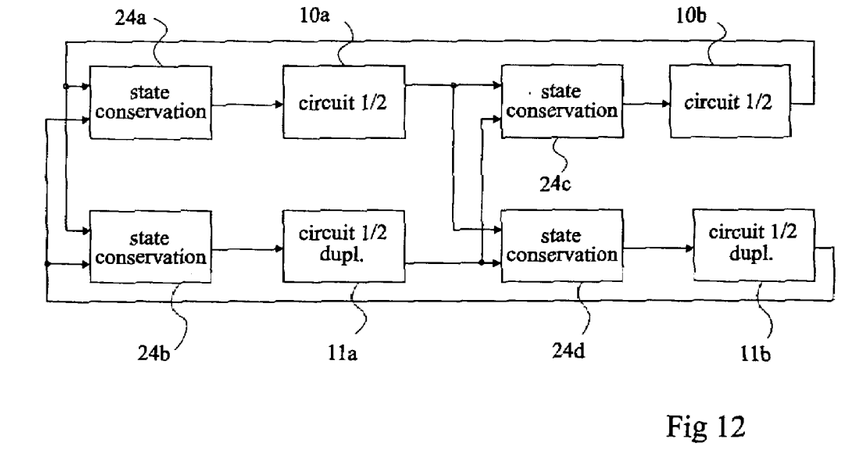
FIG. 12 shows an improvement of the structure of FIG. 11.

FIG. 12 shows a structure avoiding this problem. Circuit 10 and its duplicated circuit 11 are each divided up into two portions, 10a and 10b for circuit 10, and 11a and 11b for circuit 11. Between the two portions of each circuit, an additional state-keeping element 24c is inserted between portions 10a and 10b, and an element 24d is inserted between portions 11a and 11b, elements 24c and 24d being connected in the same way as elements 24a and 24b.

Figure 13:
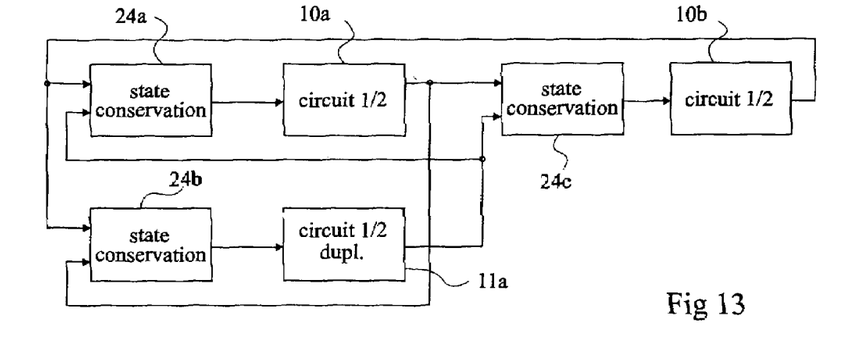
FIG. 13 shows a simplification of the structure of FIG. 12.

FIG. 13 shows a simplification of the structure of FIG. 12, made possible if portions 10a, 10b and their duplicated portions have the same logic function and receive the same inputs. As compared to FIG. 12, circuit 11b and element 24d have been omitted. State-keeping elements 24a and 24b respectively receive the output of circuit 11a and the output of circuit 10a instead of the output of circuit 11b of FIG. 12.

Figure 14:
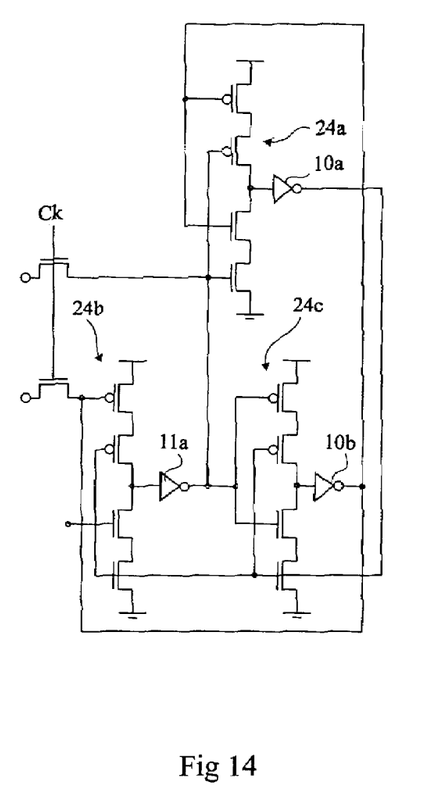
FIG. 14 shows an application of the principle of FIG. 13 to a static memory cell.

FIG. 14 shows an application of the principle of FIG. 13 to form a static memory cell. State-keeping elements 24a, 24b and 24c are state-keeping inverters of the type in FIG. 6A. Circuit portions 10a, 11a, and 10b are conventional inverters. A state-keeping inverter followed by a conventional inverter have an identity function. This ensures that elements 24a, 24b, and 24c receive identical input values, which is also valid for inverters 10a, 11a, and 10b.

The memory cell thus obtained is insensitive to disturbances, in static operation as well as in dynamic operation.

Figure 15:
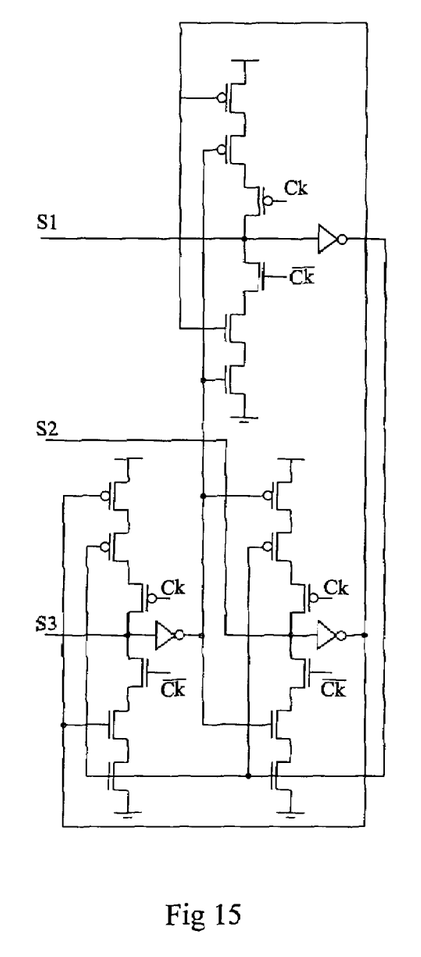
FIG. 15 shows a majority vote circuit formed from the structure of FIG. 14.

FIG. 15 shows an alternative of the cell of FIG. 14. A P-channel MOS transistor controlled by a clock signal CK has been inserted in series with each of the P-channel MOS transistor pairs. An N-channel MOS transistor controlled by the complement of clock signal CK has been inserted in series with each of the N-channel MOS transistor pairs. These transistors suppress cell switching current surges.

Further, FIG. 15 shows an application of the structure of FIG. 14 to a vote circuit usable in the circuits of FIGS. 7A and 8A. For this purpose, with respect to FIG. 14, the access transistors have been omitted. The three input signals S1, S2, and S3 of the vote circuit are applied to the inverter inputs.

A vote circuit which is used to memorize the result of the vote in a way insensitive to disturbances is thus obtained. If this vote circuit is used in FIGS. 7A and 8A, flip-flops 70 to 72, which come before the vote circuit, are mere controlled-transparency flip-flops.

A conventional memory cell controlled by a clock signal may further be connected to each of inputs S1, S2, and S3. A master-slave flip-flop is thus formed.

In the foregoing description, the case where flip-flops sensitive to transitions are used to lock the output states of a logic circuit has been considered. The present invention also applies to flip-flops sensitive to states (controlled-transparency flip-flops).

The invention claimed is:

1. A method for protecting a binary signal against transient disturbances, said binary signal having a first state or a second state, the method comprising the acts of:

generating a duplication of said binary signal for use in protecting said binary signal ("a duplicated binary signal"), wherein the duplicated binary signal has a first state or a second state;

providing an output signal that has a first value when said binary signal and said duplicated binary signal are both in the first state for at least an initialization time duration, and the output signal having a second value when said binary signal and said duplicated binary signal are both in the second state for at least the initialization time duration;

maintaining said output signal value after the initialization time duration when said binary signal and said duplicated binary signal are in different states;

whereby said output signal is insensitive to perturbations affecting one of said binary signal and said duplicated binary signal at any time following an instant at which the output signal has taken one of said first or second value in response to a change of state of said binary signal and said duplicated binary signal.

2. The method of claim 1, wherein said duplicated binary signal is generated by a duplication of a circuit generating said binary signal.

3. The method of claim 1, wherein said duplicated binary signal is a reverse of said binary signal, and said duplicated binary signal and said binary signal are considered as being in a same state when they are mutually inverted.

4. A circuit for protecting a binary signal against transient disturbances, having a first input for receiving a binary signal, a second input for receiving a duplication of said binary signal for use in protecting said binary signal, and the circuit having an output for providing an output signal that has a first value when said binary signal and said duplicated binary signal are both in a first state for at least an initialization time duration, and the output signal having a second value when said binary signal and said duplicated binary signal are both in a second state for at least an initialization time duration, said output signal being maintained when said binary signal and said duplicated binary signal are in different states, whereby said output signal is insensitive to perturbations affecting one of said binary signal and said duplicated binary signal at any time following an instant at which the output signal has taken one of said first or second value in response to a change of state of said binary signal and said duplicated binary signal.

5. The circuit of claim 4, wherein a memory element of the circuit is formed from a logic gate providing said output signal, said logic gate including at least two first transistors (MN1, MP2) controlled by said binary signal and at least two second transistors (MP1, MN2) controlled by said duplicated binary signal, each of the second transistors being connected in series with a respective one of the first transistors.

* * * * *